(12) United States Patent
Anderson et al.

(10) Patent No.: US 7,087,506 B2
(45) Date of Patent: Aug. 8, 2006

(54) METHOD OF FORMING FREESTANDING SEMICONDUCTOR LAYER

(75) Inventors: Brent A Anderson, Jericho, VT (US); Edward J Nowak, Essex Junction, VT (US); BethAnn Rainey, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/604,116

(22) Filed: Jun. 26, 2003

(65) Prior Publication Data

US 2005/0009305 A1    Jan. 13, 2005

(51) Int. Cl.
*H01L 21/324* (2006.01)
(52) U.S. Cl. ............... 438/488; 438/489; 438/700; 438/760; 438/761; 438/763; 438/778
(58) Field of Classification Search ........ 438/166, 438/482, 485, 488, 496, 626, 631, 637, 641, 438/660, 778, FOR. 388, FOR. 393, FOR. 395, 438/489, 700, 702, 703, 760, 761, 763, 959
See application file for complete search history.

(56) References Cited

U.S. PATENT DOCUMENTS

| | | | | |
|---|---|---|---|---|
| 5,328,813 A | * | 7/1994 | Strandjord et al. | 430/321 |
| 5,581,101 A | * | 12/1996 | Ning et al. | 257/347 |
| 5,723,370 A | | 3/1998 | Ning et al. | |
| 5,795,830 A | * | 8/1998 | Cronin et al. | 438/696 |
| 6,492,212 B1 | | 12/2002 | Ieong et al. | |
| 2002/0181523 A1 | | 12/2002 | Pinneo et al. | |

FOREIGN PATENT DOCUMENTS

EP    0721221 A2    7/1996

OTHER PUBLICATIONS

Doo, V.Y., "Method of Making Submicron Channel MOSFET," IBM Technical Disclosure Bulletin, vol. 24, No. 7A, Dec. 1981, pp. 3407-3408.

* cited by examiner

*Primary Examiner*—George R. Fourson
*Assistant Examiner*—Joannie Adelle Garcia
(74) *Attorney, Agent, or Firm*—William D. Sabo; Hoffman, Warnick & D'Alessandro LLC

(57) ABSTRACT

A method of providing a freestanding semiconductor layer on a conventional SOI or bulk-substrate silicon device includes forming an amorphous or polycrystalline mandrel on a monocrystalline base structure. A conformal polycrystalline semiconductor layer is then formed on the mandrel and on the base structure, wherein the polycrystalline layer contacts the base structure. The polycrystalline semiconductor layer is then recrystallized so that it has a crystallinity substantially similar to that of the base structure. Thus, a freestanding semiconductor layer is formed with a high degree of control of the thickness and height thereof and maintaining a uniformity of thickness.

20 Claims, 3 Drawing Sheets

METHOD OF FORMING FREESTANDING SEMICONDUCTOR LAYER

BACKGROUND OF INVENTION

1. Technical Field

The invention relates generally to semiconductor devices and more specifically to a freestanding semiconductor layer formed on a semiconductor device.

2. Related Art

In CMOS technologies, such as in the design and fabrication of field effect transistors (FETs), integrated circuit density has grown and continues to increase at a significant rate. To facilitate the increase in device density, new methods are constantly needed to allow the feature size of these semiconductor devices to be reduced.

Fin FET is currently considered a leading candidate for CMOS technology beyond the 65 nanometer (nm) range. Methods to produce fins, also known as freestanding semiconductor layers, for FinFETs have generally centered around using some form of a mask or etch stop, either e-beam, conventional lithography, or sidewall-image transfer, with which to etch thin silicon freestanding semiconductor layers from a silicon-on-insulator (SOI) or bulk-substrate silicon crystal. The traditional material used for forming a freestanding semiconductor layer and the masking process thereof may be expensive and may still not be accurate enough to provide a uniformity of thickness of the freestanding semiconductor layer, which is important in fabricating an FET with dependable and accurate performance.

Thus, a challenge of this technology is to provide a very thin silicon freestanding semiconductor layer with a high degree of control of the thickness thereof. Another challenge is to maintain uniformity of thickness from the top to the bottom of the freestanding semiconductor layer. Furthermore, a challenge of this technology is to provide for a precise and inexpensive method of forming a thin, uniform freestanding semiconductor layer on conventional SOI or bulk-substrate silicon devices.

Accordingly, a need has developed in the art for a method of forming a freestanding semiconductor layer on a conventional SOI or bulk-substrate silicon device that will provide a high degree of control of the thickness and height thereof and maintain uniformity of thickness from the top to the bottom of the freestanding semiconductor layer.

SUMMARY OF INVENTION

The present invention provides a method for forming a freestanding semiconductor layer on a conventional SOI or bulk-substrate silicon device that will provide a high degree of control of the thickness and height thereof and maintain uniformity of thickness of the freestanding semiconductor layer.

Generally, a first aspect of the present invention is directed to a method of forming a freestanding semiconductor layer, comprising the steps of: forming a non-monocrystalline mandrel on a monocrystalline base structure; forming a conformal polycrystalline semiconductor layer on at least one sidewall of the mandrel, the polycrystalline layer contacting the monocrystalline base structure; and recrystallizing the polycrystalline semiconductor layer to have a crystallinity substantially similar to that of the base structure.

In addition, a second aspect of the present invention provides a semiconductor device comprising a monocrystalline base structure; and a conformal monocrystalline freestanding semiconductor layer contacting the monocrystalline base structure, the freestanding semiconductor layer having a crystallinity substantially similar to that of the base structure.

The present invention also provides a method of forming a field-effect transistor having at least one freestanding semiconductor layer comprising the steps of: forming a non-monocrystalline mandrel on a monocrystalline base structure; forming a conformal polycrystalline semiconductor layer on at least one sidewall of the mandrel, the polycrystalline layer contacting the monocrystalline base structure; recrystallizing the polycrystalline semiconductor layer to have a crystallinity substantially similar to that of the base structure; removing the mandrel; and forming a gate structure on the semiconductor layer.

The foregoing and other features of the invention will be apparent from the following more particular description of embodiments of the invention, as illustrated in the accompanying drawings.

BRIEF DESCRIPTION OF DRAWINGS

Embodiments of the present invention will hereinafter be described in conjunction with the appended drawings, where like designations denote like elements, and wherein.

DETAILED DESCRIPTION

Figure 1:
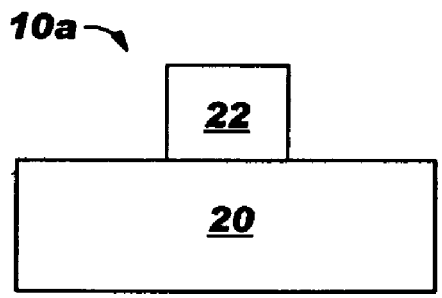
FIGS. 1, 2, 3, 4, and 5 are cross-sectional views of a bulk-substrate silicon semiconductor wafer illustrating one set of steps that may be used to form a freestanding semiconductor layer in accordance with a first embodiment of the present invention.

FIGS. 1–6 illustrate the steps for forming a freestanding semiconductor layer 26 on a conventional silicon-based bulk-substrate semiconductor wafer (i.e., base structure 20) shown in cross-section (FIGS. 1–5) and plan view (FIG. 6), in accordance with a first embodiment of the present invention. As seen in FIG. 1, the first step 10*a* is forming a mandrel 22 on base structure 20. Base structure 20 in this embodiment is a bulk-substrate silicon wafer that is of a monocrystalline material, such as silicon (Si). Mandrel 22 is formed on base structure 20 through patterning and etching a deposited or grown material on base structure 20. Mandrel 22 may consist of an amorphous material, or a polycrystalline material, such as silicon oxide ($SiO_2$) or silicon nitride ($Si_3N_4$), or other similar materials as known in the art.

Figure 2:
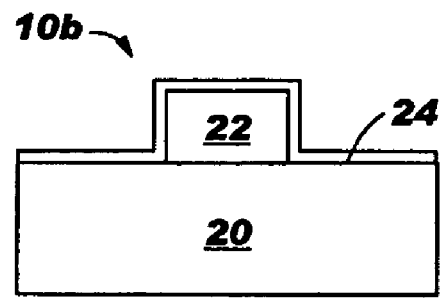

In FIG. 2, the second step 10*b* includes forming a conformal semiconductor layer 24 on mandrel 22 and base structure 20. Semiconductor layer 24 is either epitaxially grown or deposited upon base structure 20 and at least one sidewall of mandrel 22 in a conformal manner. If semiconductor layer 24 is epitaxially grown, the microstructure of semiconductor layer 24, which contacts base structure 20, will take on the crystal orientation of base structure 20. Thus, the contact between semiconductor layer 24 and base structure 20 allows for an inexpensive and efficient recrystallization process for sections of semiconductor layer 24, and thus formation of a freestanding semiconductor layer 26 (FIG. 4) once mandrel 22 is removed. If deposited, semiconductor layer 24 will initially be made up of a polycrystalline material, such as polysilicon. Semiconductor layer 24 will then take on the crystal orientation of base structure 20 when recrystallized through heat by annealing (around 600Å° C.), or through other known recrystallization methods in the art. Recrystallization will, in most cases, occur after step 10c in reference to FIG. 3, but may also occur after step 10d in reference to FIG. 4.

Figure 3:
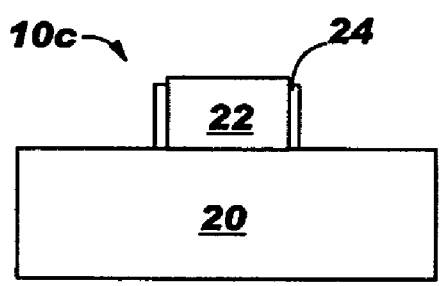

As seen in FIG. 3, the next step 10c in forming a freestanding semiconductor layer is selective removal of predetermined sections of semiconductor layer 24. In this specific embodiment, the sections of semiconductor layer 24 that were not deposited or grown on the sidewall of mandrel 22 are removed, though the present invention is not limited to such. Semiconductor layer 24 may be selectively anisotropically etched, or planarized and then etched, allowing the formation of a tall, thin freestanding semiconductor layer 26 (FIG. 4).

Figure 4:
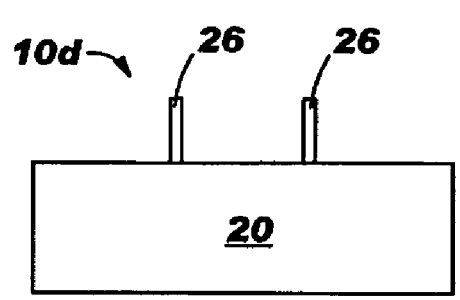

FIG. 4 illustrates the next step 10d, wherein mandrel 22 is removed from base structure 20, leaving freestanding semiconductor layer 26. Since mandrel 22 does not comprise the same material as freestanding semiconductor layer 26, the removal of mandrel 22 through etching or similar methods does not affect the structure of freestanding semiconductor layer 26. Furthermore, an etch stop is not needed to define the boundaries to be removed. Hence, the thickness of freestanding semiconductor layer 26 is determined by the epitaxial growth, or deposition of polysilicon, while the height is determined by the thickness of mandrel 22. Thus, freestanding semiconductor layer 26 is uniformly thin and tall and takes on the crystal orientation of base structure 20.

Figure 5:
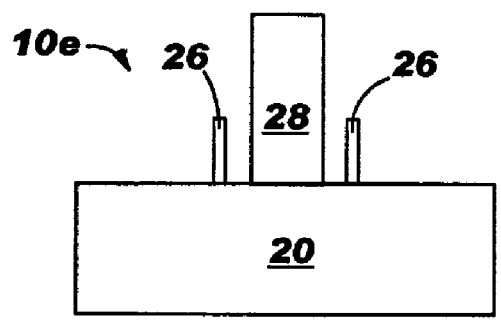
Figure 6:
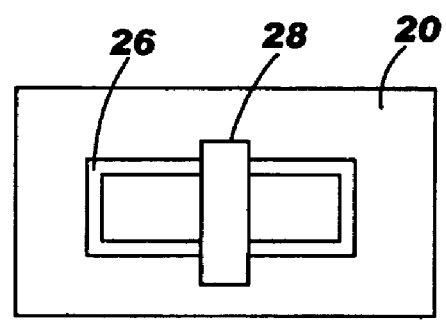
FIG. 6 is a plan view of FIG. 5.

FIGS. 5 and 6 illustrate in step 10e forming a gate structure 28 of doped polysilicon on base structure 20, wherein FIG. 5 shows the cross-sectional view of this process and FIG. 6 illustrates the plan view. Gate structure 28 is formed through the patterning and etching of a deposited polysilicon (not shown). Gate structure 28 is also formed across freestanding semiconductor layer 26 (FIG. 6), and thus contacts freestanding semiconductor layer 26. A transistor, such as an FET, then may be fabricated through the formation of extensions, halos, and source and drain regions (not shown), which process is well known in the art.

FIGS. 7–10 illustrate the steps for forming freestanding semiconductor layer 51 (FIG. 10) on a conventional silicon-on-insulator (SOI) semiconductor wafer (including bottom layer 40 and insulating layer 46) shown in cross-section, in accordance with a second embodiment of the present invention.

Figure 7:
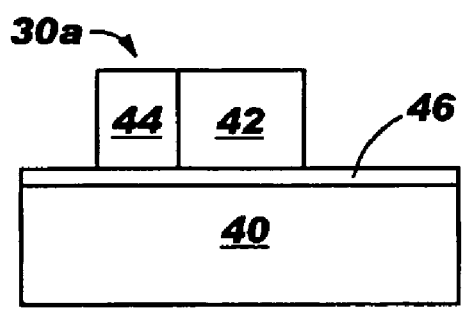
FIGS. 7, 8, 9, and 10 are cross-sectional views of a silicon-on-insulator (SOI) semiconductor wafer illustrating a second set of steps that may be used to form a freestanding semiconductor layer in accordance with a second embodiment of the present invention.

As seen in FIG. 7, the first step 30a is forming a base structure 44 and mandrel material 42 on insulating layer 46, wherein mandrel material 42 is also formed on a sidewall of base structure 44. Base structure 44 is formed on insulating layer 46 through a patterned etch of the active silicon of a SOI wafer, and then patterning and etching the silicon into a predetermined shape. Thus, the remaining base structure 44 is a monocrystalline semiconductor. Mandrel material 42 is then formed through depositing or growing an amorphous or polycrystalline material over base structure 44 and insulating layer 46 and planarizing mandrel material 42 to base structure 44. Both mandrel material 42 and base structure 44 are patterned and etched to form a second mandrel including both mandrel material 42 and base structure 44. In this specific embodiment, mandrel material 42 is made up of $Si_3N_4$, but is not limited to such.

Figure 8:
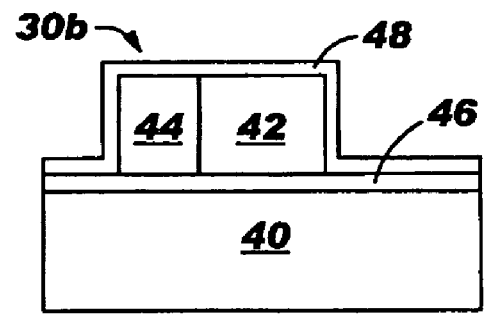

In FIG. 8, the second step 30b includes forming a conformal semiconductor layer 48 on mandrel material 42, base structure 44, and insulating layer 46. Semiconductor layer 48 is either epitaxially grown deposited upon insulating layer 46, base structure 44 and at least one sidewall of mandrel material 42 in a conformal manner. If deposited, semiconductor layer 48 will initially be of a polycrystalline material, such as polysilicon. If semiconductor layer 48 is epitaxially grown, the sections of semiconductor layer 48 that are not in contact with base structure 44 will initially be polycrystalline and the sections of semiconductor layer 48 contacting base structure 44 will take on the crystal orientation of base structure 44. In either case, the entire semiconductor layer 48 takes on the crystal orientation of base structure 44 when recrystallized through heat by annealing (around 600Å° C.), or other known recrystallization methods in the art.

Figure 9:
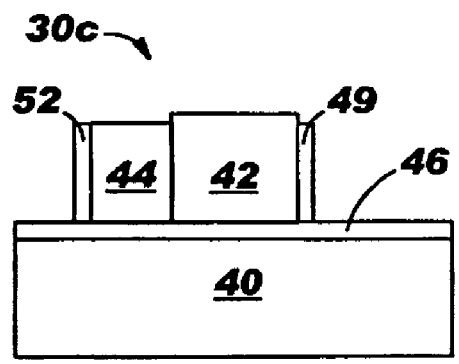
Figure 10:
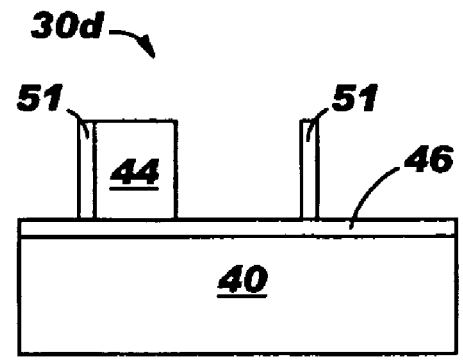

As seen in FIG. 9, the next step 30c in forming a freestanding semiconductor layer 51 (FIG. 10) is through selective removal of semiconductor layer 48 (FIG. 8). Semiconductor layer 48 may be selectively etched by an anisotropic etch, or planarized and then etched, allowing the formation of tall, thin semiconductor layers 52 and 49. As aforementioned, if semiconductor layer 48 is epitaxially grown, semiconductor layer 52, which is in contact with base structure 44, will take on the crystal orientation of base structure 44; and semiconductor layer 49, which is not in contact with base structure 44, will continue to be of a polycrystalline material, at least until recrystallized. If semiconductor layer 48 is deposited, both semiconductor layer 52 and semiconductor layer 49 will be of a polycrystalline material until recrystallized.

Furthermore, ince FIG. 9 illustrates a cross-section of semiconductor layers 52 and 49, base structure 44 and mandrel material 42, in this specific embodiment, it is to be understood that, although not shown, base structure 44 still contacts at least one sidewall of mandrel material 42 and semiconductor layers 52 and 49 still contact the remaining sidewalls of mandrel material 42 after being etched. That is, semiconductor layer 52 and semiconductor layer 49 are one continuous layer, forming a thin, tall rectangular, or similar shape, around mandrel material 42 and base structure 44. Although in this specific embodiment, semiconductor layer 52 and semiconductor layer 49 are one continuous layer, the present invention is not limited by such, and more than one layer may be formed.

1FIG. 0 illustrates the next step 30d, wherein mandrel material 42 is removed from base structure 44 and insulating layer 46, leaving freestanding semiconductor layer 51 and base structure 44. Since mandrel material 42 does not comprise the same material as freestanding semiconductor layer 51 and base structure 44, the removal of mandrel material 42 through selective etching or similar methods does not affect the structure of freestanding semiconductor layer 51. Furthermore, an etch stop is not needed to define the boundaries to be removed. As with the first embodiment of the present invention, the thickness of freestanding semiconductor layer 51 is determined by the epitaxial growth, or deposition of polysilicon, while the height is determined by the thickness of mandrel material 42. Freestanding semiconductor layer 51 takes on the crystal orientation of base structure 44.

Figure 11:
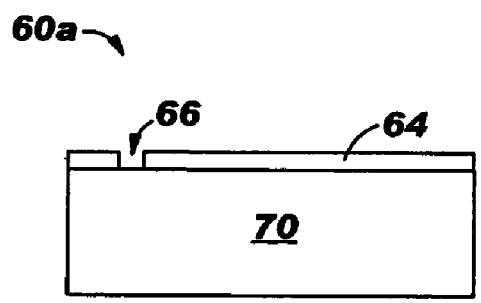
FIGS. 11, 12, 13, 14, and 15 are cross-sectional views of an SOI semiconductor wafer illustrating a third set of steps that may be used to form a freestanding semiconductor layer in accordance with a third embodiment of the present invention.
Figure 12:
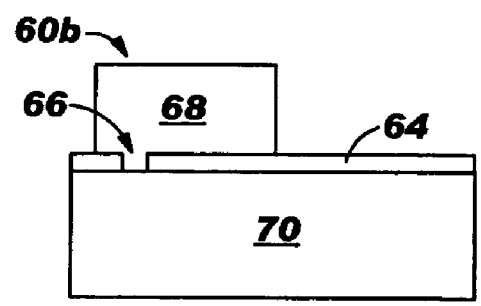
Figure 13:
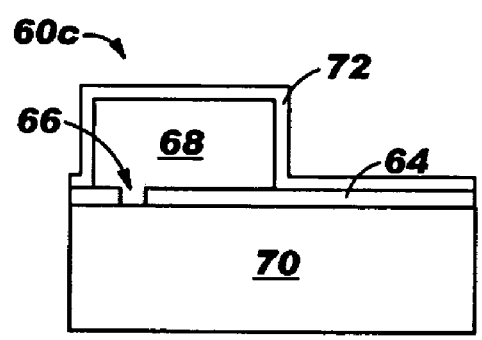

FIGS. 11–16 illustrate the steps for a forming freestanding semiconductor layer 74 (FIG. 16) on a conventional SOI semiconductor wafer (with base structure 70 and insulating layer 64) shown in cross-section (FIGS. 11–15) and plan view (FIG. 16) in accordance with a third embodiment of the present invention. As seen in FIG. 11, the first step 60a is etching aperture 66 through insulating layer 64 to base structure 70. Base structure 70 in this embodiment is an SOI semiconductor wafer that is of a monocrystalline material, such as silicon (Si). Although only one aperture 66 shown in FIG. 11, the present invention is not limited to such. Other apertures may be formed through insulating layer 64 for multiple contacts of base structure 70 with either mandrel 68 (FIG. 13) or semiconductor layer 72 (FIG. 13).

FIG. 12 shows the next step 60b of forming a mandrel 68 on insulating layer 64 and base structure 70, wherein mandrel 68 contacts base structure 70 through aperture 66. In this embodiment, aperture 66 is greater in width than mandrel 68, allowing contact to base structure 70 on either side of mandrel 68 formed on base structure 70. Mandrel 68 may be formed on insulating layer 64 and base structure 70 through patterning and etching a deposited or grown material on insulating layer 64 and base structure 70. Mandrel 68 may include an amorphous or polycrystalline material, such as $Si_3N_4$, or other similar materials as known in the art.

In FIG. 13, the third step 60c includes forming a conformal semiconductor layer 72 on insulating layer 64, mandrel 68, and base structure 70 (through aperture 66). Semiconductor layer 72 is either epitaxially grown or deposited upon insulating layer 64, base structure 70 and at least one sidewall of mandrel 68 in a conformal manner. If deposited, semiconductor layer 72 will initially be made up of a polycrystalline material, such as polysilicon. If semiconductor layer 72 is epitaxially grown, the microstructure of semiconductor layer 72, which contacts base structure 70 on either side of mandrel 68 through aperture 66, will take on the crystal orientation of base structure 70. Thus, the contact between semiconductor layer 72 and base structure 70 allows for an inexpensive and efficient recrystallization process for sections of semiconductor layer 72. In both cases, whether deposited or epitaxially grown, semiconductor layer 72 substantially takes on the crystal orientation of base structure 70 when recrystallized through heat by annealing (around 600Å° C.), or through other known recrystallization methods in the art. Recrystallization will, in most cases, occur after step 60d in reference to FIG. 14, but may also occur after step 60e in reference to FIG. 15.

Figure 14:
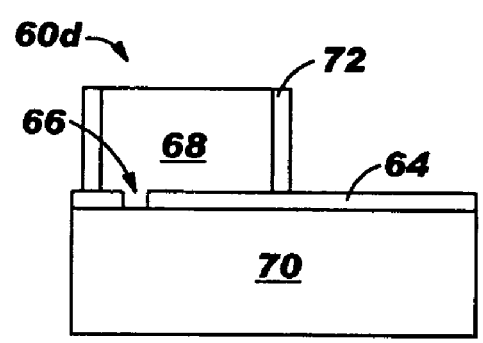

As seen in FIG. 14, the next step 60d in forming a freestanding semiconductor layer 74 (FIG. 16) is through selective removal of semiconductor layer 72. In this specific embodiment, the sections of semiconductor layer 72 that were not deposited or grown on the sidewall of mandrel 68 are removed, though the present invention is not limited to such. Semiconductor layer 72 may be selectively anistropically etched, or planarized and then etched, allowing the formation of a tall, thin freestanding semiconductor layer 74 (FIG. 15).

Figure 15:
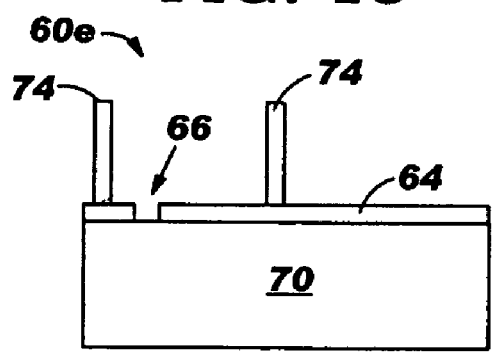

FIG. 15 illustrates the next step 60e wherein mandrel 68 is removed from the base structure 70, leaving freestanding semiconductor layer 74. Since mandrel 68 does not comprise the same material as freestanding semiconductor layer 74, the removal of mandrel 68 through etching or similar methods does not affect the structure of freestanding semiconductor layer 74. Furthermore, an etch stop is not needed to define the boundaries to be removed. As aforementioned, the thickness of freestanding semiconductor layer 74 is determined by the epitaxial growth, or deposition of polysilicon, while the height is determined by the thickness of mandrel 68. Thus, freestanding semiconductor layer 74 is uniformly thin and tall and takes on the crystal orientation of base structure 70.

Figure 16:
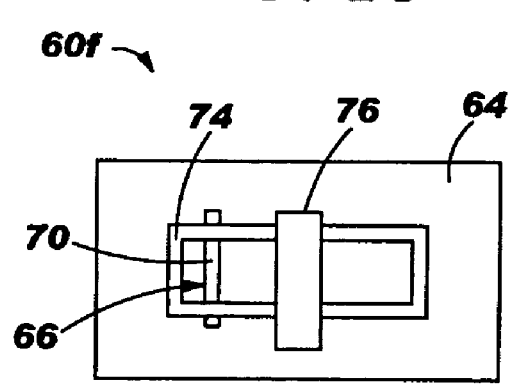
FIG. 16 is a plan view of a freestanding semiconductor layer formed as illustrated FIGS. 11, 12, 13, 14 and 15.

FIG. 16 illustrates, in plan view, step 60f, wherein a gate structure 76 of doped polysilicon is formed on insulating layer 64 and across freestanding semiconductor layer 74. Gate structure 76 is formed through the patterning and etching of a deposited polysilicon (not shown). A transistor then may be fabricated through the formation of extensions, halos, and source and drain regions (not shown), which process is well known in the art.

Thus, this invention provides a method of forming a freestanding semiconductor layer on a conventional SOI or bulk-substrate silicon wafer that will provide a high degree of control of the thickness and height thereof and maintain uniformity of thickness of the freestanding semiconductor layer.

While the invention has been particularly shown and described with reference to specific embodiments thereof, it will be understood by those skilled in the art that the foregoing and other changes in form and details may be made therein without departing from the spirit and scope of the invention.

The invention claimed is:

1. A method of forming a freestanding semiconductor layer, comprising the steps of:
   a) forming a non-monocrystalline mandrel on a monocrystalline base structure;
   b) forming a conformal polycrystalline semiconductor layer on at least one sidewall of the mandrel, the polycrystalline layer contacting the monocrystalline base structure; and
   c) recrystallizing the polycrystalline semiconductor layer to have a crystallinity substantially similar to that of the base structure.

2. The method of claim 1, wherein the step of forming a conformal polycrystalline semiconductor layer further comprises the steps of:
   b1) depositing the polycrystalline semiconductor layer on the base structure and the mandrel; and
   b2) selectively removing a portion of the polycrystalline semiconductor layer, wherein a remaining portion of the polycrystalline layer contacts at least one sidewall of the mandrel and the base structure.

3. The method of claim 1, wherein the step of forming a conformal polycrystalline semiconductor layer further comprises the steps of:
   b1) growing the polycrystalline semiconductor layer on the base structure and the mandrel; and
   b2) selectively removing a portion of the polycrystalline semiconductor layer.

4. The method of claim 1, wherein the step of recrystallizing the polycrystalline semiconductor layer further comprises the steps of:
   c1) removing the mandrel; and
   c2) recrystallizing the polycrystalline semiconductor layer through annealing.

5. The method of claim 1, wherein the step of recrystallizing the polycrystalline semiconductor layer further comprises the steps of:
   c1) recrystallizing the polycrystalline semiconductor layer through annealing; and
   c2) removing the mandrel.

6. The method of claim 1, further comprising the step of: providing an insulating layer.

7. The method of claim 6, wherein the step of forming a non-monocrystalline mandrel further comprises the steps of:

a1) forming the base structure on the insulating layer;
a2) depositing the mandrel on the insulating layer and the base structure;
a3) planarizing the mandrel to the base structure; and
a4) selectively removing a portion of the mandrel and the base structure from the insulating layer.

8. The method of claim 6, wherein the step of forming a non-monocrystalline mandrel farther comprises the steps of:
   a1) forming an insulator material on the monocrystalline base structure;
   a2) forming at least one aperture in the insulator material; and
   a3) forming the non-monocrystalline mandrel on the insulator material and on the base structure, wherein the mandrel contacts the base structure through the at least one aperture.

9. The method of claim 8, wherein the step of forming a conformal polycrystalline semiconductor layer further comprises the step of:
   b1) forming the semiconductor layer on the base structure through the at least one aperture.

10. The method of claim 6, wherein the insulator layer and the base structure form a silicon-on-insulator wafer.

11. A method of forming a field-effect transistor having at least one freestanding semiconductor layer comprising the steps of:
    a) forming a non-monocrystalline mandrel on a monocrystalline base structure;
    b) forming a conformal polycrystalline semiconductor layer on at least one sidewall of the mandrel, the polycrystalline layer contacting the monocrystalline base structure;
    c) recrystallizing the polycrystalline semiconductor layer to have a crystallinity substantially similar to that of the base structure;
    d) removing the mandrel; and
    e) forming a gate structure on the semiconductor layer.

12. The method of claim 11, wherein the step of forming a conformal polycrystalline semiconductor layer further comprises the steps of:
    b1) depositing the polycrystalline semiconductor layer on the base structure and the mandrel; and
    b2) selectively removing a portion of the polycrystalline semiconductor layer, wherein a remaining portion of the polycrystalline layer contacts at least one sidewall of the mandrel and the base structure.

13. The method of claim 11, wherein the step of forming a conformal polycrystalline semiconductor layer further comprises the steps of:
    b1) growing the polycrystalline semiconductor layer on the base structure and the mandrel; and
    b2) selectively removing a portion of the polycrystalline semiconductor layer.

14. The method of claim 11, wherein the step of forming a non-monocrystalline mandrel further comprises the steps of:
    a1) providing an insulating layer;
    a2) forming the base structure on the insulating layer;
    a3) depositing the mandrel on the insulating layer and the base structure;
    a4) planarizing the mandrel to the base structure; and
    a5) selectively removing a portion of the mandrel and the base structure from the insulating layer.

15. The method of claim 11, wherein the step of forming a non-monocrystalline mandrel further comprises the steps of:
    a1) providing an insulator material;
    a2) forming the insulator material on the monocrystalline base structure;
    a3) forming at least one aperture in the insulator material; and
    a4) forming the non-monocrystalline mandrel on the insulator material and on the base structure, wherein the mandrel contacts the base structure through the at least one aperture.

16. A method of forming a freestanding semiconductor layer, comprising the steps of:
    a) forming a non-monocrystalline mandrel on a monocrystalline base structure;
    b) forming a conformal polycrystalline semiconductor layer on at least one sidewall of the mandrel, the polycrystalline layer contacting the monocrystalline base structure;
    c) growing the polycrystalline semiconductor layer on the base structure and the mandrel;
    d) selectively removing a portion of the polycrystalline semiconductor layer;
    e) recrystallizing the polycrystalline semiconductor layer to have a crystallinity substantially similar to that of the base structure; and
    f) removing the mandrel.

17. The method of claim 16, wherein the step of forming a conformal polycrystalline semiconductor layer further comprises the steps of:
    b1) depositing the polycrystalline semiconductor layer on the base structure and the mandrel; and
    b2) selectively removing a portion of the polycrystalline semiconductor layer, wherein a remaining portion of the polycrystalline layer contacts at least one sidewall of the mandrel and the base structure.

18. The method of claim 16, further wherein the step of recrystallizing the polycrystalline semiconductor layer is via annealing.

19. The method of claim 16, further comprising the step of:
    providing an insulating layer.

20. The method of claim 19, wherein the stop of forming a non-monocrystalline mandrel further comprises the steps of:
    a1) forming the base structure on the insulating layer;
    a2) depositing the mandrel on the insulating layer and the base structure;
    a3) planarizing the mandrel to the base structure; and
    a4) selectively removing a portion of the mandrel and the base structure from the insulating layer.

* * * * *